(12) United States Patent
Classen et al.

(10) Patent No.: US 9,067,778 B2
(45) Date of Patent: Jun. 30, 2015

(54) METHOD FOR MANUFACTURING A HYBRID INTEGRATED COMPONENT

(71) Applicants: Johannes Classen, Reutlingen (DE); Heribert Weber, Nuertingen (DE)

(72) Inventors: Johannes Classen, Reutlingen (DE); Heribert Weber, Nuertingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 194 days.

(21) Appl. No.: 13/865,825

(22) Filed: Apr. 18, 2013

(65) Prior Publication Data

US 2013/0285165 A1    Oct. 31, 2013

(30) Foreign Application Priority Data

Apr. 25, 2012   (DE) .......................... 10 2012 206 875

(51) Int. Cl.

| | |
|---|---|
| *H01L 21/30* | (2006.01) |
| *H01L 29/84* | (2006.01) |
| *B81B 7/00* | (2006.01) |
| *B81C 3/00* | (2006.01) |
| *B81C 1/00* | (2006.01) |

(52) U.S. Cl.
CPC ......... *B81B 7/008* (2013.01); *H01L 2924/1433* (2013.01); *B81C 3/001* (2013.01); *B81C 2203/0771* (2013.01); *B81C 1/00238* (2013.01); *B81C 1/00246* (2013.01); *B81C 2203/0735* (2013.01); *B81C 2203/0785* (2013.01)

(58) Field of Classification Search
CPC   H01L 2924/1433; B81B 7/008; B81C 3/001; B81C 1/00238; B81C 1/00246; B81C 2203/0771; B81C 2203/0785; B81C 2203/0735

See application file for complete search history.

(56) References Cited

U.S. PATENT DOCUMENTS

| 8,748,998 | B2 * | 6/2014 | Frey et al. ...................... 257/415 |
|---|---|---|---|
| 8,866,238 | B2 * | 10/2014 | Classen ......................... 257/416 |
| 2008/0273424 | A1 * | 11/2008 | Wodnicki et al. ............. 367/180 |
| 2008/0315331 | A1 * | 12/2008 | Wodnicki et al. ............. 257/414 |
| 2011/0049652 | A1 | 3/2011 | Wu et al. |
| 2011/0248403 | A1 * | 10/2011 | Chandrasekaran et al. .. 257/770 |
| 2013/0299928 | A1 * | 11/2013 | Classen et al. ................ 257/417 |

\* cited by examiner

*Primary Examiner* — Alonzo Chambliss
(74) *Attorney, Agent, or Firm* — Kenyon & Kenyon LLP

(57) ABSTRACT

A manufacturing method for hybrid integrated components having a very high degree of miniaturization is provided, which hybrid integrated components each have at least two MEMS elements each having at least one assigned ASIC element. Two MEMS/ASIC wafer stacks are initially created independently of one another in that two ASIC substrates are processed independently of one another; a semiconductor substrate is mounted on the processed surface of each of the two ASIC substrates, and a micromechanical structure is subsequently created in each of the two semiconductor substrates. The two MEMS/ASIC wafer stacks are mounted on top of each other, MEMS on MEMS. Only subsequently are the components separated.

7 Claims, 11 Drawing Sheets

METHOD FOR MANUFACTURING A HYBRID INTEGRATED COMPONENT

BACKGROUND OF THE INVENTION

1. Field of the Invention

The present invention relates to a method for manufacturing a hybrid integrated component having at least two MEMS (microelectromechanical) system elements, at least one ASIC element being assigned to each.

2. Description of the Related Art

Components having MEMS elements have been manufactured in mass production for many years for greatly varying applications, for example, in the fields of automotive engineering and consumer electronics. The miniaturization of the components is increasingly gaining in significance. On the one hand, the miniaturization substantially contributes to reducing the manufacturing costs of the components and therefore also of the terminal equipment. On the other hand, in particular in the field of consumer electronics, more and more functions—and therefore components—are to be accommodated in the terminal equipment, while the terminal equipment itself becomes smaller and smaller. Therefore, less and less space is available on the application circuit boards for the individual components.

Various miniaturization concepts for sensor components are known from practice, which provide an integration in one component of the sensor function implemented by micromechanics and the circuitry-wise processing and evaluation of the sensor signals. In addition to the lateral integration of the MEMS function and the ASIC function on a shared chip, there are also already concepts for so-called vertical hybrid integration, according to which a chip stack is formed from ASIC, MEMS, and a cap wafer.

Such a vertically integrated component and a method for the manufacture thereof are described in US Patent Application Publication No. 2011/0049652 A1. The known method provides bonding the starting substrate for the MEMS element on an already processed ASIC substrate. A micromechanical structure is only produced thereafter in the MEMS substrate. Independently thereof, a cap wafer is structured and prepared for the mounting over the micromechanical structure of the MEMS substrate and on the ASIC substrate. The cap wafer thus processed is bonded on the ASIC substrate after the structuring of the MEMS substrate, so that the micromechanical structure is enclosed hermetically sealed between the ASIC substrate and the cap wafer.

The known component concept allows cost-effective mass production of robust components having a micromechanical function and a signal processing circuit, since here not only the individual component parts—MEMS element, cap, and ASIC—are manufactured in the wafer composite, but rather also their assembly is implemented to form a component on the wafer level. The MEMS functions and the ASIC functions may be tested at the wafer level, and even the calibration of the individual components may take place at the wafer level. The stacked structure of the known components also contributes toward a reduction in production costs since these components require only a comparatively small mounting area in the second level assembly.

BRIEF SUMMARY OF THE INVENTION

Measures for the implementation of hybrid integrated components are proposed with the present invention, easily and inexpensively permitting an even higher degree of miniaturization.

Hybrid integrated components having at least two MEMS elements are manufactured using the method according to the present invention, at least one ASIC element being assigned to each MEMS element. For this purpose, two MEMS/ASIC wafer stacks are initially created independently of one another by processing two ASIC substrates independently of one another, mounting a semiconductor substrate on the processed surface of each of the two ASIC substrates and subsequently creating a micromechanical structure in each of the two semiconductor substrates. The two MEMS/ASIC wafer stacks are then mounted one on top of the other, namely MEMS on MEMS. Only then are the components released from the wafer composite and separated.

Thus, according to the present invention, a wafer stack having at least four elements is manufactured. Only in this way is the component which is manufactured according to the present invention furnished with a very high functionality per unit of mounting area. One MEMS element and one ASIC element advantageously form a functional unit, for example, in the form of a micromechanical sensor element, whose signal processing and evaluation circuit is integrated on the assigned ASIC element. The micromechanical structures of the two MEMS elements of a component may be identical or similar if these elements are supposed to fulfill comparable functions. However, within the context of the method according to the present invention, MEMS elements having completely different functions and thus also completely different micromechanical structures may also be combined in one component.

The structure according to the present invention is suitable in particular for the implementation of contactless operating sensors, e.g., acceleration sensors, yaw rate sensors and other inertial sensors. In the case of an inertial sensor, the micromechanical sensor structure includes at least one elastically suspended seismic mass, which is deflected due to accelerations. These accelerations may also be induced by centrifugal forces or rotational movements. The deflections of the seismic mass are detected and evaluated. The micromechanical structure of such a sensor element should be capped to minimize environmental influences on the measuring signal and to protect the sensor structure from contaminants, moisture and particles. Defined pressure conditions for the sensor structure, which significantly codetermine the damping behavior of the sensor, may also be created in this way. Such capping or encapsulation is achieved according to the present invention by the sandwich configuration of the MEMS elements between the assigned ASIC elements without requiring separate cap structures.

The manufacturing method according to the present invention may be varied in many different ways, in particular with regard to the mechanical and electrical connection between the individual components of the four-fold wafer stack and the external electrical contacting of the resulting components. The function, the purpose and the installation site of the component to be manufactured must all be taken into account here.

As already mentioned, signal processing and evaluation circuits for the assigned MEMS elements are preferably integrated on the ASIC elements. However, the ASIC elements may of course also be furnished with other circuit functions. Furthermore, a structuring of the surface on which the MEMS substrate is to be mounted may also be carried out within the context of processing the ASIC substrates. Recesses in the ASIC surface as well as a pedestal structure for the mounting of the MEMS substrate may be provided. The mobility of structural elements in the assigned MEMS element, for example, may be ensured in this way.

The connection between the MEMS substrate and the ASIC substrate is preferably established in a bonding process since in this way a hermetically sealed mechanical connection as well as reliable electrical connections may be implemented between the MEMS element and the ASIC element. A number of method variants, which are known and have been tested in practice, are available for this purpose.

The sensitivity of a micromechanical inertial sensor depends essentially on the size of the seismic mass. One variant of the manufacturing method according to the present invention is suitable in particular for the implementation of MEMS elements having a comparatively large seismic mass. The seismic mass is defined and exposed in a structuring process, extending over the entire thickness of the MEMS substrate. A seismic mass having a maximum thickness, namely the thickness of the MEMS substrate, may be produced for this purpose. The MEMS substrate is therefore initially thinned down to a predefined structural height. In the context of this thinning and polishing process, the resulting surface of the MEMS element may already be prepared for the connection to the additional MEMS element, at least with regard to its roughness.

The MEMS structure is preferably created in a trench process since trench structures having a particularly high aspect ratio may be produced in this way.

With regard to a preferably compact structure of the component and reliable internal electrical contacting between the individual parts of the component, it has proven advantageous if through-contacts are created in at least one of the two MEMS substrates, establishing an electrical connection between the assigned ASIC substrate and the surface of the MEMS substrate facing away from this ASIC substrate.

As with the mounting of the MEMS substrates on the assigned ASIC substrates, the MEMS/ASIC wafer stacks are preferably also assembled in a bonding process since it is possible to easily establish reliable and durable mechanical and electrical connections between the two MEMS/ASIC wafer stacks in this way.

The end product of the method according to the present invention is in any case a component having at least two MEMS elements, one ASIC element being assigned to each, the two MEMS elements being mounted one on top of the other and sandwiched between the two ASIC elements, so that the micromechanical structures of the two MEMS elements are capped by the two ASIC elements. The micromechanical structures advantageously each extend over the entire thickness of one of the two MEMS elements.

The mechanical fixation of such a component within the context of a second level assembly takes place in each case via one of the two ASICs. Through-contacts permitting direct mounting of the component on a circuit board are advantageously formed in this ASIC element. In addition to the mechanical fixation of the component on the circuit board, an electrical connection to the printed conductors on the circuit board is also established. However, the external electrical contacting of such a component may also take place via wire bonds when corresponding exposed terminal pads are formed on at least one of the ASICs.

DETAILED DESCRIPTION OF THE INVENTION

Within the context of the method according to the present invention for manufacturing a hybrid integrated component having two MEMS elements, at least one ASIC element being assigned to each, two MEMS/ASIC wafer stacks are initially created independently of one another. This is explained in greater detail below in conjunction with FIGS. 1 through 7.

Figure 1:
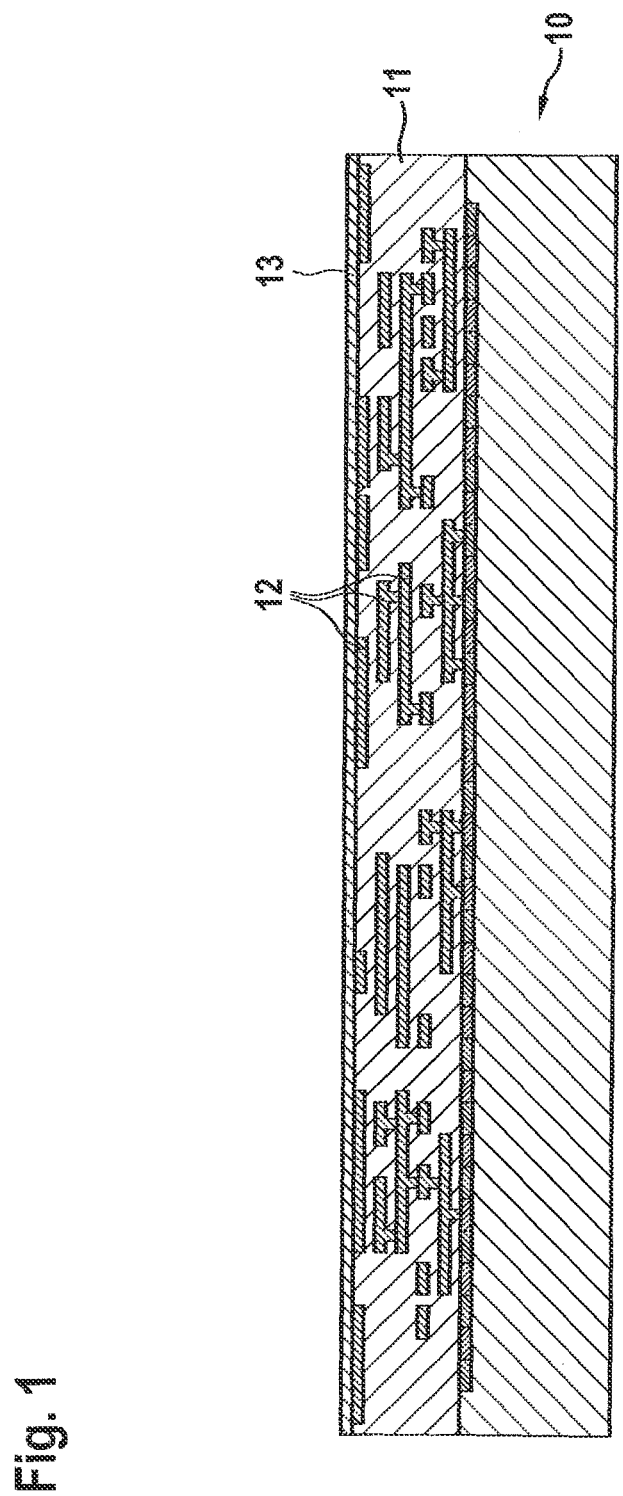
FIGS. 1 through 7 illustrate the manufacture of an MEMS/ASIC wafer stack using the method according to the present invention on the basis of schematic sectional diagrams.

The starting point for manufacturing such an MEMS/ASIC wafer stack is a processed ASIC substrate 10, as illustrated in FIG. 1. Multiple circuit levels 12 are formed in an oxide layer 11 on ASIC substrate 10. At least parts of a signal processing and evaluation circuit for the assigned MEMS element are advantageously integrated here. In addition, however, MEMS-independent circuit functions may also be implemented. The CMOS processing of ASIC substrate 10 is not described in detail here since it is not specified in detail by the present invention. The substrate surface is provided with a nitride passivation 13.

Figure 2:
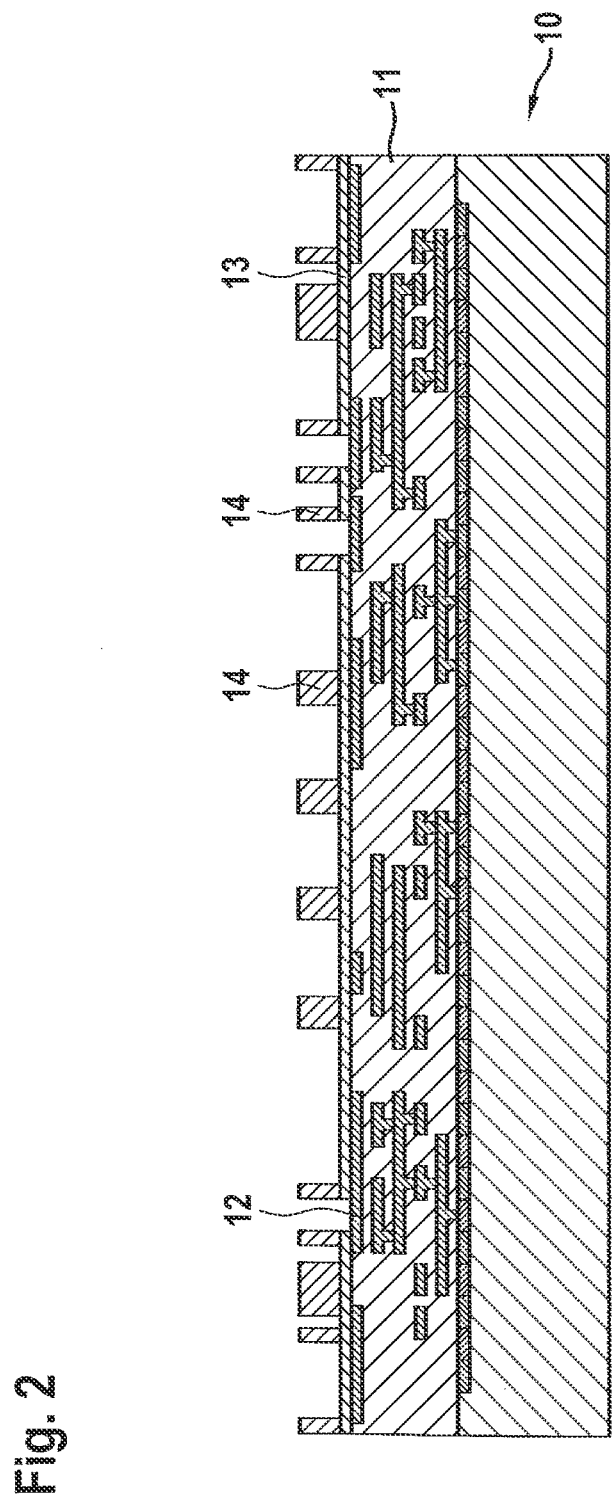

This passivation layer 13 is structured to permit electrical contacting of top circuit level 12 of ASIC substrate 10. In the present exemplary embodiment, a standoff structure 14 for the mounting of an MEMS substrate is then created. An oxide layer 14 is therefore deposited on the surface of ASIC substrate 10 over structured passivation layer 13 and is then structured in a suitable way. FIG. 2 shows the result of this structuring process.

Figure 3:
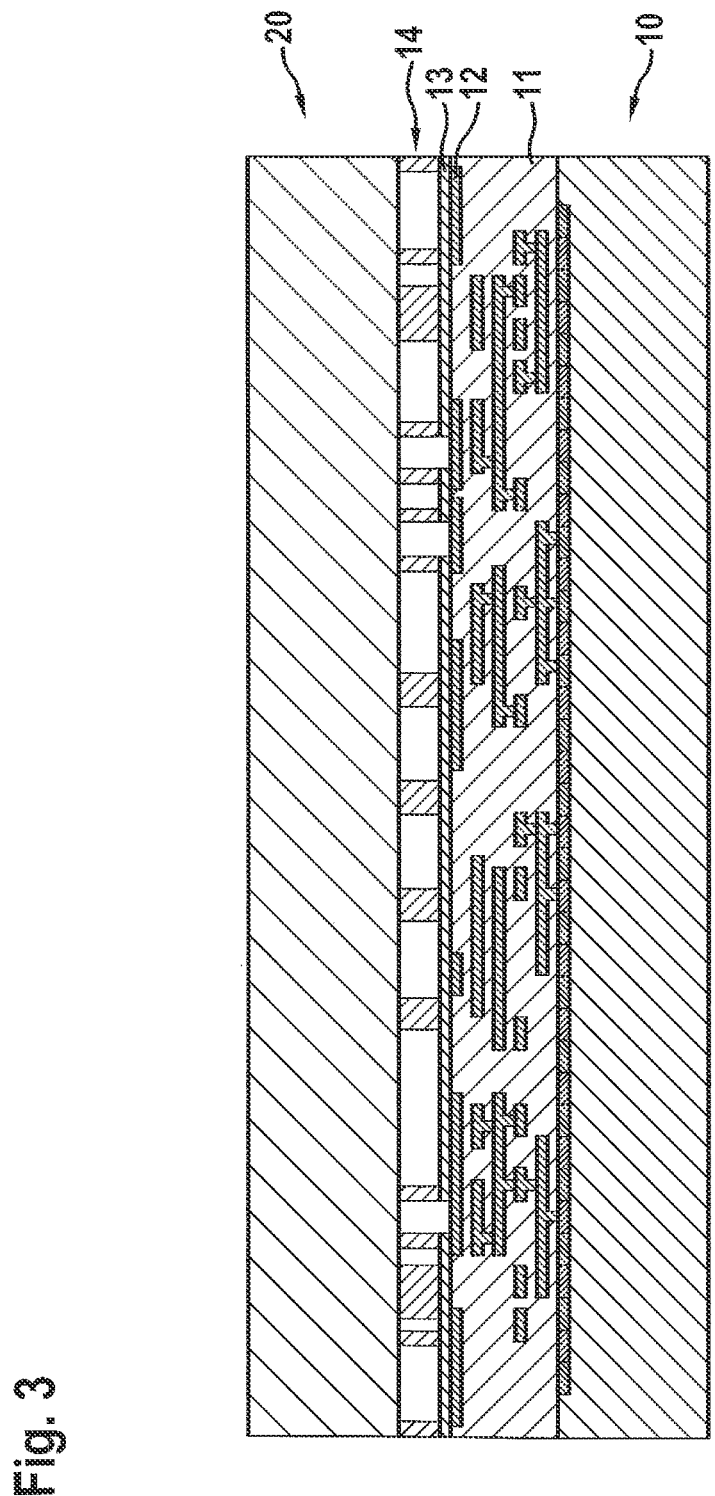

Structured oxide layer 14 forms the mounting surface for an unstructured MEMS substrate 20. The connection between MEMS substrate 20 and ASIC substrate 10 is established here in a plasma-activated direct bond method and is hermetically sealed. Relatively thick MEMS substrate 20 is then thinned down until its thickness corresponds approximately to the intended structural height of the MEMS element. This is typically in a range between 10 μm and 150 μm. For this purpose, MEMS substrate 20 is initially ground and then polished to remove scratches and damage to the silicon crystal. The polishing operation also provides the substrate surface with a roughness suitable for the MEMS-on-MEMS assembly. FIG. 3 shows ASIC substrate 10 having MEMS substrate 20, which has already been thinned but is still unstructured, with standoff structure 14 functioning as a spacer between the closed surface of ASIC substrate 10 and MEMS substrate 20.

MEMS substrate 20 is structured only in the composite with ASIC substrate 10. This structuring is carried out in two steps in the present exemplary embodiment.

Figure 4:
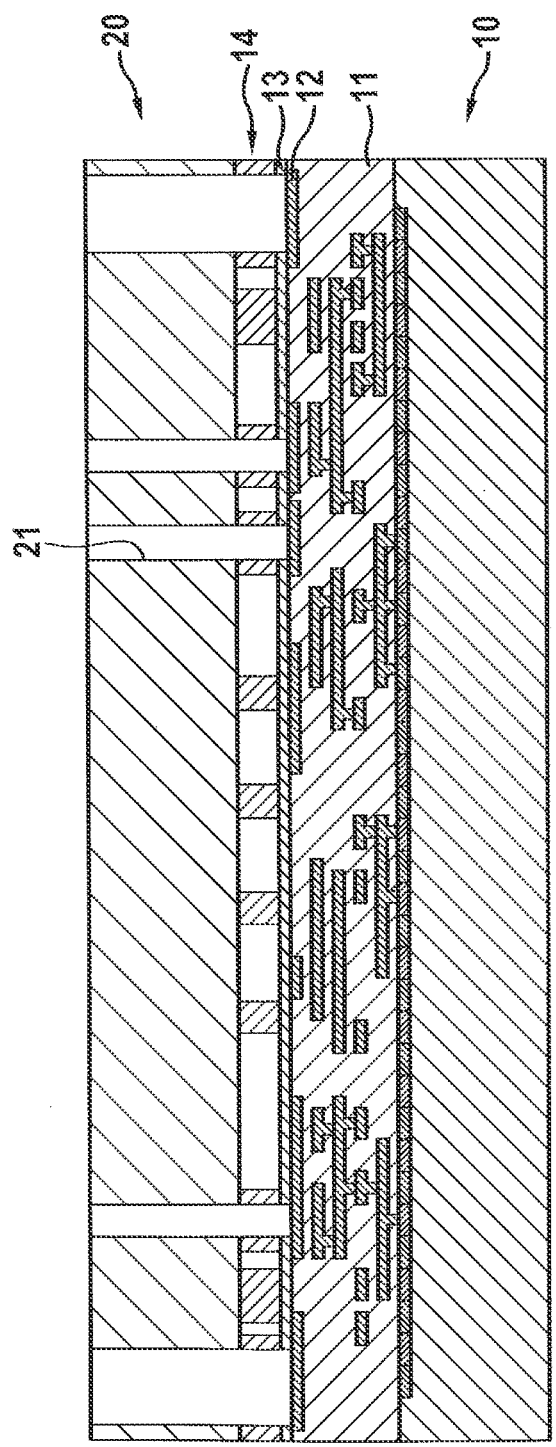
Figure 5:
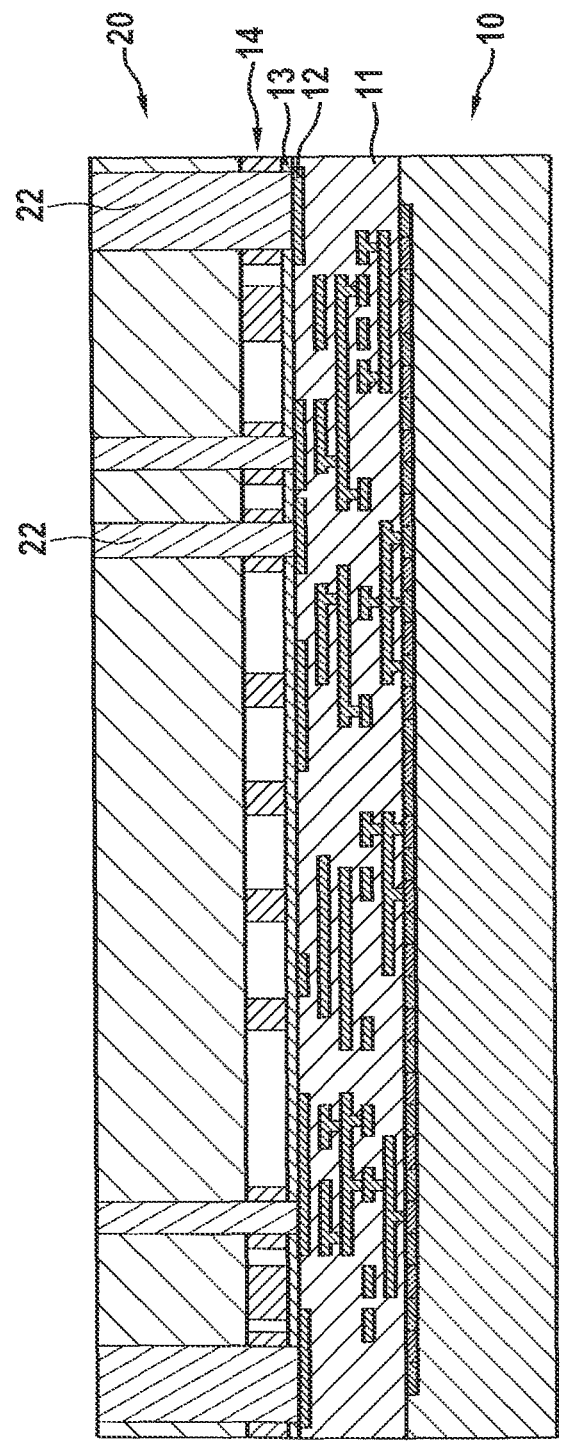
Figure 6:
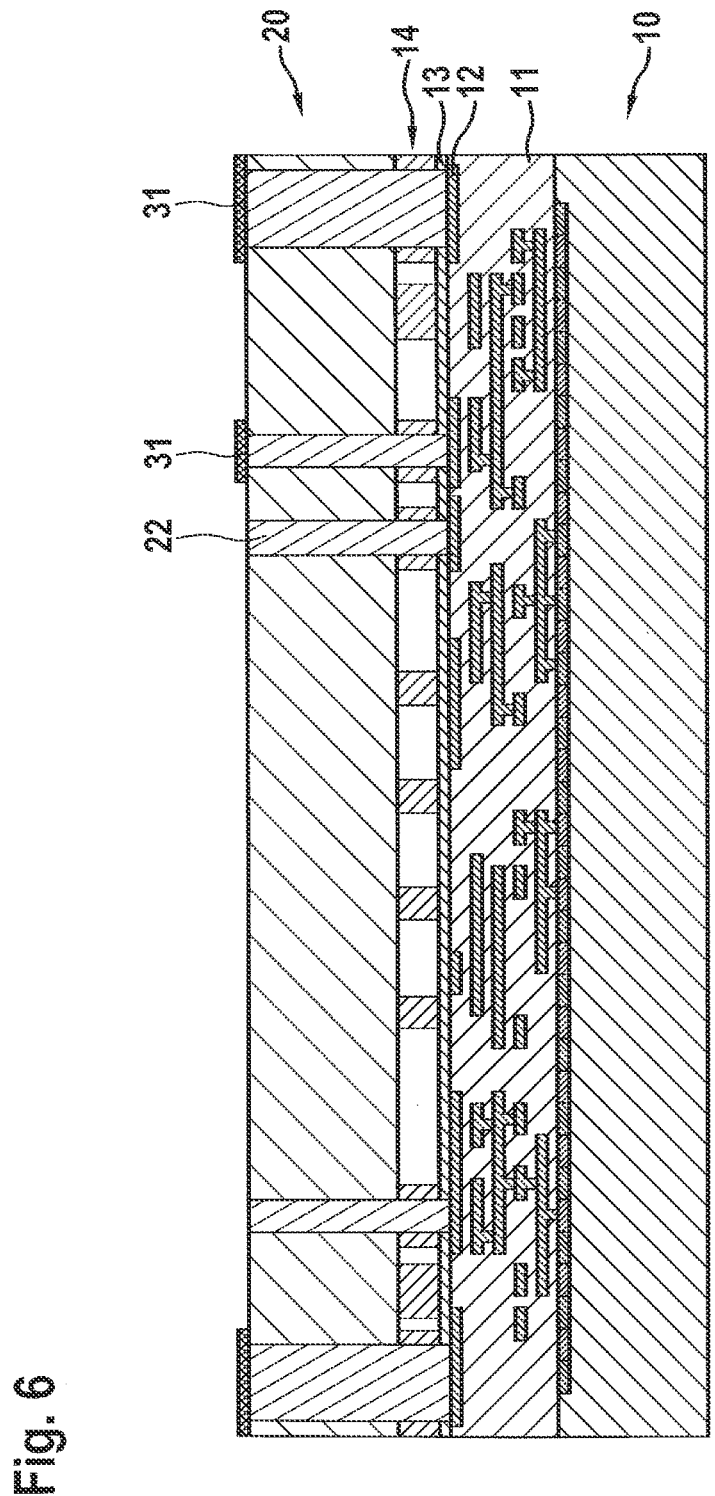

The first etching step is used for creating through-contacts, so-called vias 22. Through-openings 21 having an essentially circular cross section are created in MEMS substrate 20 and structured oxide layer 14, namely where passivation layer 13 has been opened for electrical contacting of ASIC substrate 10. FIG. 4 shows the configuration of through-openings 21. Through-openings 21 preferably have an aspect ratio of 5:1 to 20:1 and extend over the entire thickness of MEMS substrate 20 through structured oxide layer 14 to first circuit level 12 of ASIC substrate 10. Through-openings 21 are filled in a deposition process with an electrically conductive material 22, such as copper or tungsten. FIG. 5 shows ASIC substrate 10 and MEMS substrate 20 after the filling of through-openings 21 and after the conductive material deposited on the surface of MEMS substrate 20 has been removed. The surface of MEMS substrate 20 is subsequently provided with a structured bond layer 31, in particular also in the areas above some of vias 22, as shown in FIG. 6. Structured bond layer 31 is discussed in greater detail below in conjunction with FIGS. 8 and 9.

Figure 7:
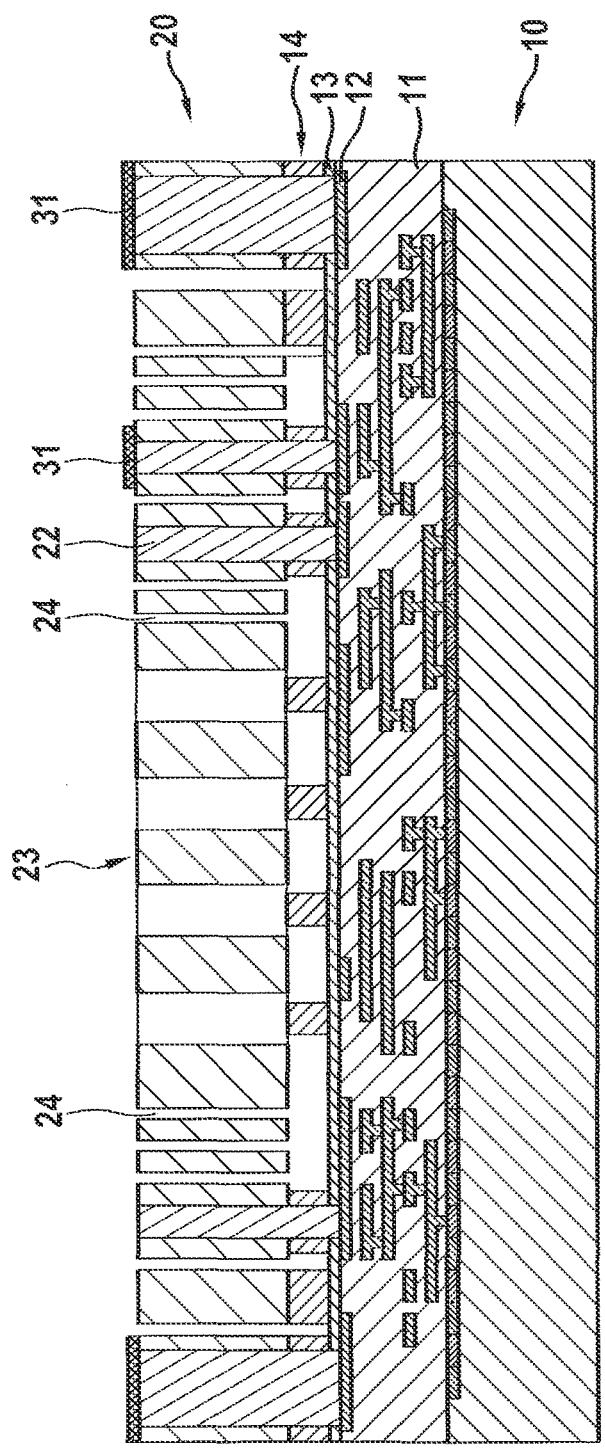

The micromechanical structure of the MEMS element is created in the second etching step, likewise extending over the entire thickness of MEMS substrate 20 here, as shown in FIG. 7. For both the first and the second etching steps, a trench process is preferably selected as the etching process since it allows the creation of structures having a particularly high aspect ratio. In the present case, the micromechanical structure includes multiple resiliently suspended seismic masses 23 defined and exposed by trenches 24 in MEMS substrate 20. Standoff structure 14 on ASIC substrate 10 ensures the mobility of seismic masses 23.

According to the present invention, two such MEMS/ASIC wafer stacks are now mounted on top of each other, MEMS on MEMS, as shown in FIG. 7. It should be pointed out again here explicitly that these need not be two identical MEMS/ASIC wafer stacks but instead two MEMS/ASIC wafer stacks having different structures and functions may be combined. This variant is illustrated in FIGS. 8 and 9.

Figure 8:
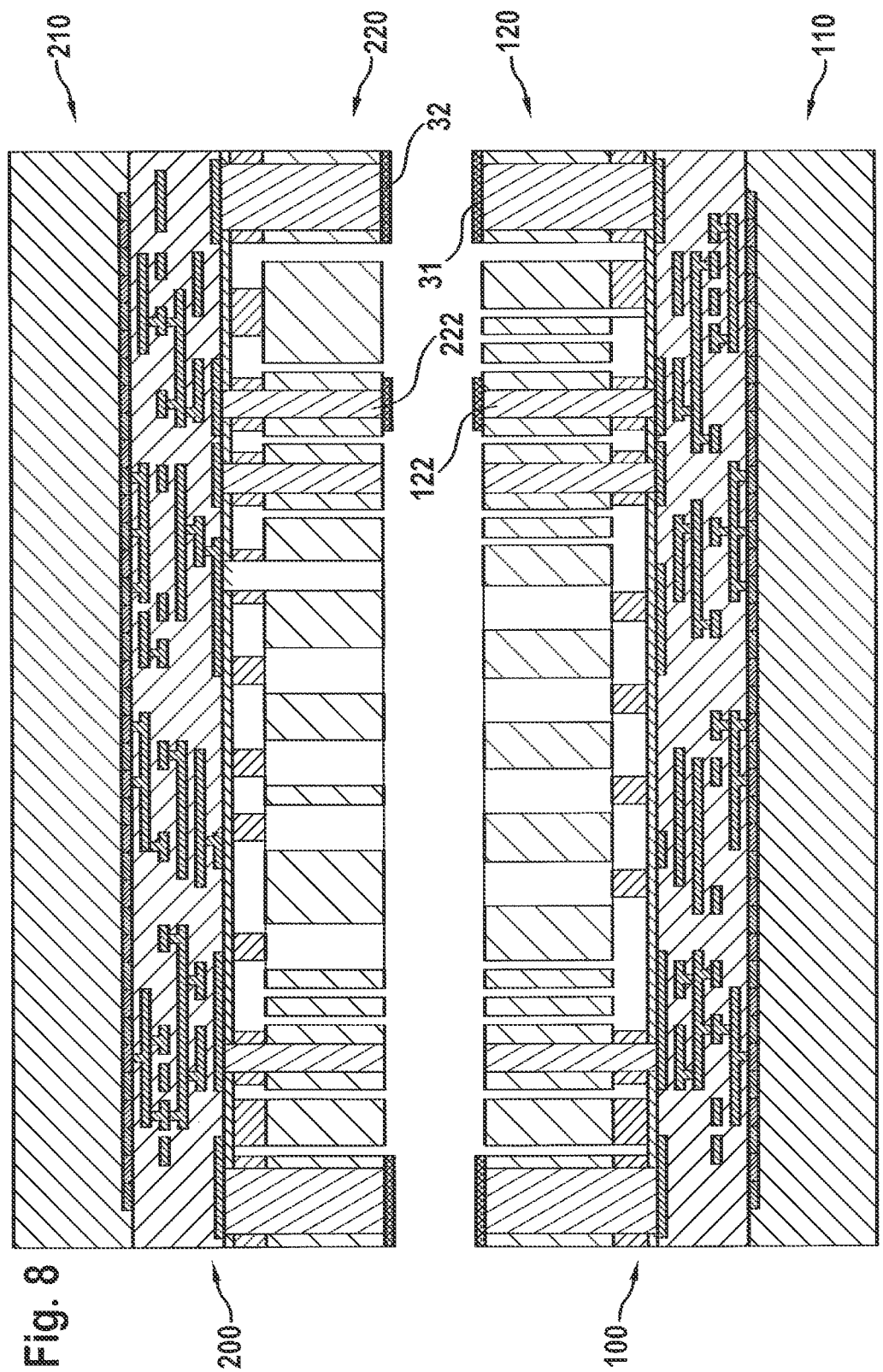
FIGS. 8 and 9 illustrate the structure of a part according to the present invention, starting from two MEMS/ASIC wafer stacks on the basis of schematic sectional diagrams.

FIG. 8 shows two hybrid integrated MEMS/ASIC wafer stacks 100 and 200, situated one on top of the other, oriented MEMS on MEMS. The micromechanical structures of the two MEMS substrates 120 and 220 are not identical. Two MEMS/ASIC wafer stacks 100 and 200 are merely coordinated with one another in the configuration of vias 122 and 222 and in the structuring of bond layers 31 and 32 on the surfaces of MEMS substrates 120 and 220. In a bond process, a permanent mechanical connection is then established between the two MEMS/ASIC wafer stacks 100 and 200 in the area of bond layers 31, 32. The micromechanical structures of the two MEMS components 120 and 220 are advantageously hermetically sealed, the internal pressure prevailing in the resulting cavity 30 between the two ASIC substrates 110 and 210 being predefinable.

Figure 9:
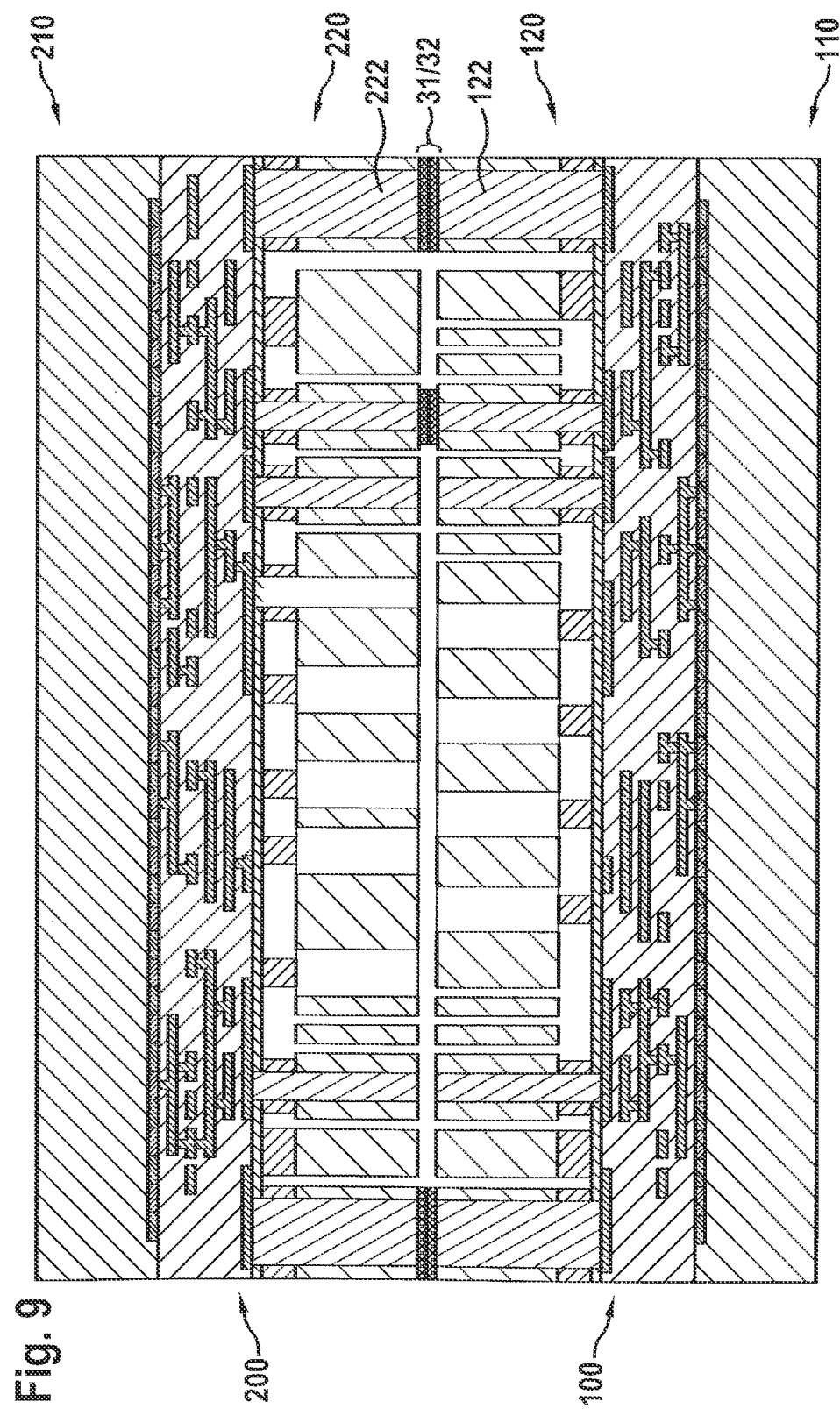

In addition to the mechanical connection, electrical connections are also established between the two MEMS/ASIC wafer stacks 100 and 200 via bond layers 31 and 32, as illustrated in FIG. 9. Bond layers 31 and 32 together with vias 122 and 222 thus form electrical connections between the two ASIC substrates 110 and 210.

Only after the assembly of the two MEMS/ASIC wafer stacks 100 and 200 as described above are the individual components removed from the wafer composite. The components may be separated by sawing, for example.

A component manufactured in this way may easily be mounted on a substrate, e.g., a circuit board, within the scope of the second level assembly via one of the two ASICs and contacted electrically there since all other parts of the component are electrically connected to this ASIC via the vias and bond connections and therefore are also electrically contactable via this ASIC.

Figure 10:
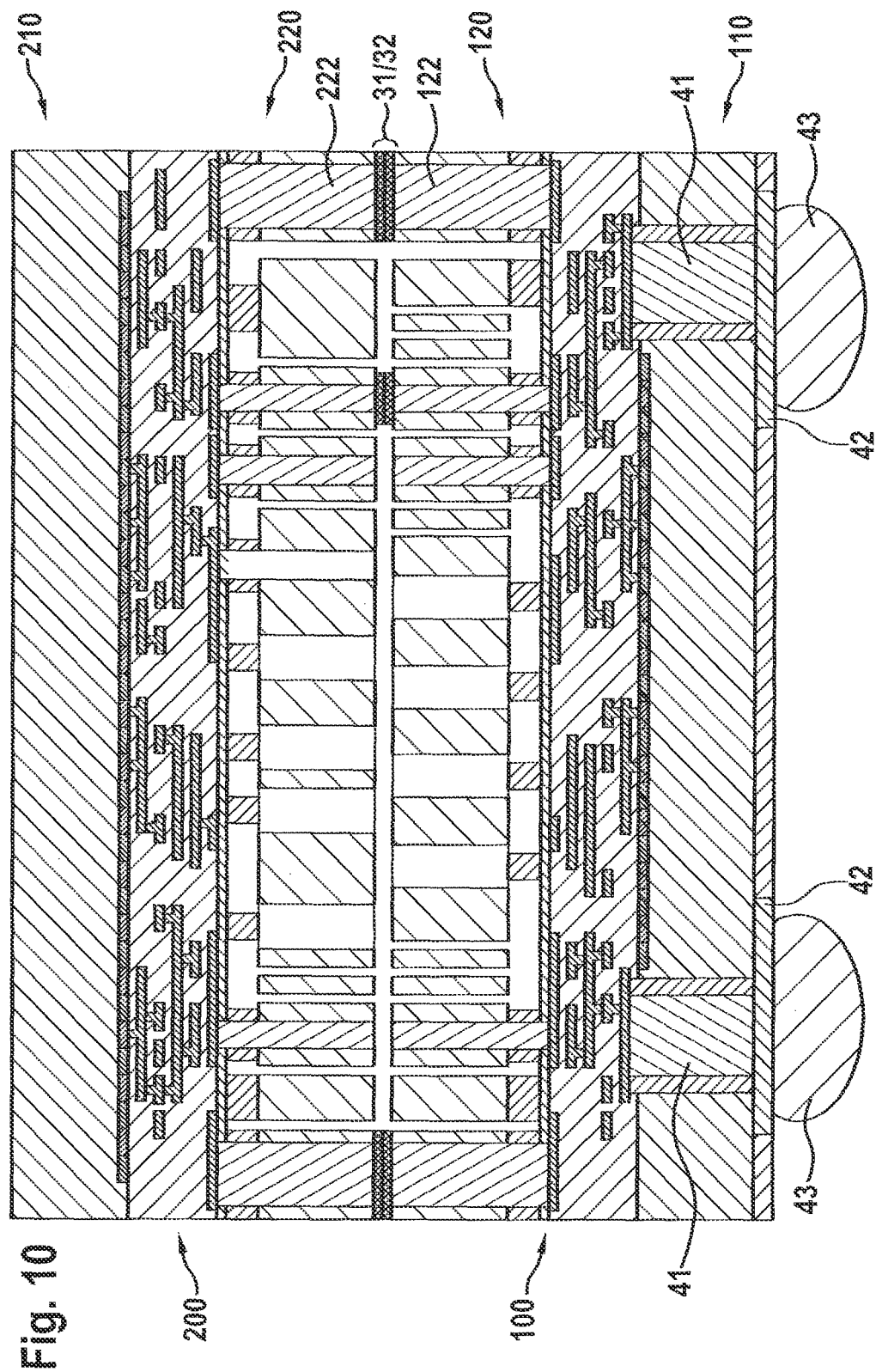
FIGS. 10 and 11 illustrate two different possibilities for external electrical contacting of a component manufactured according to the present invention on the basis of schematic sectional diagrams.

One option for the implementation of the external contacting of a component according to the present invention, which is suitable in particular for direct mounting on circuit boards, is shown in FIG. 10. The electrical signals of component 40 are led outward here via through-contacts 41, so-called TSVs (through silicon vias) in ASIC 110. These TSVs 41 extend from lowest circuit level 12 of ASIC 110 to its rear side, where terminal pads 42 are formed and function as a mounting surface for component 40. The electrical connection to a circuit board may be established here easily with the aid of solder bumps 43, via which component 40 is also secured mechanically on the circuit board.

Figure 11:
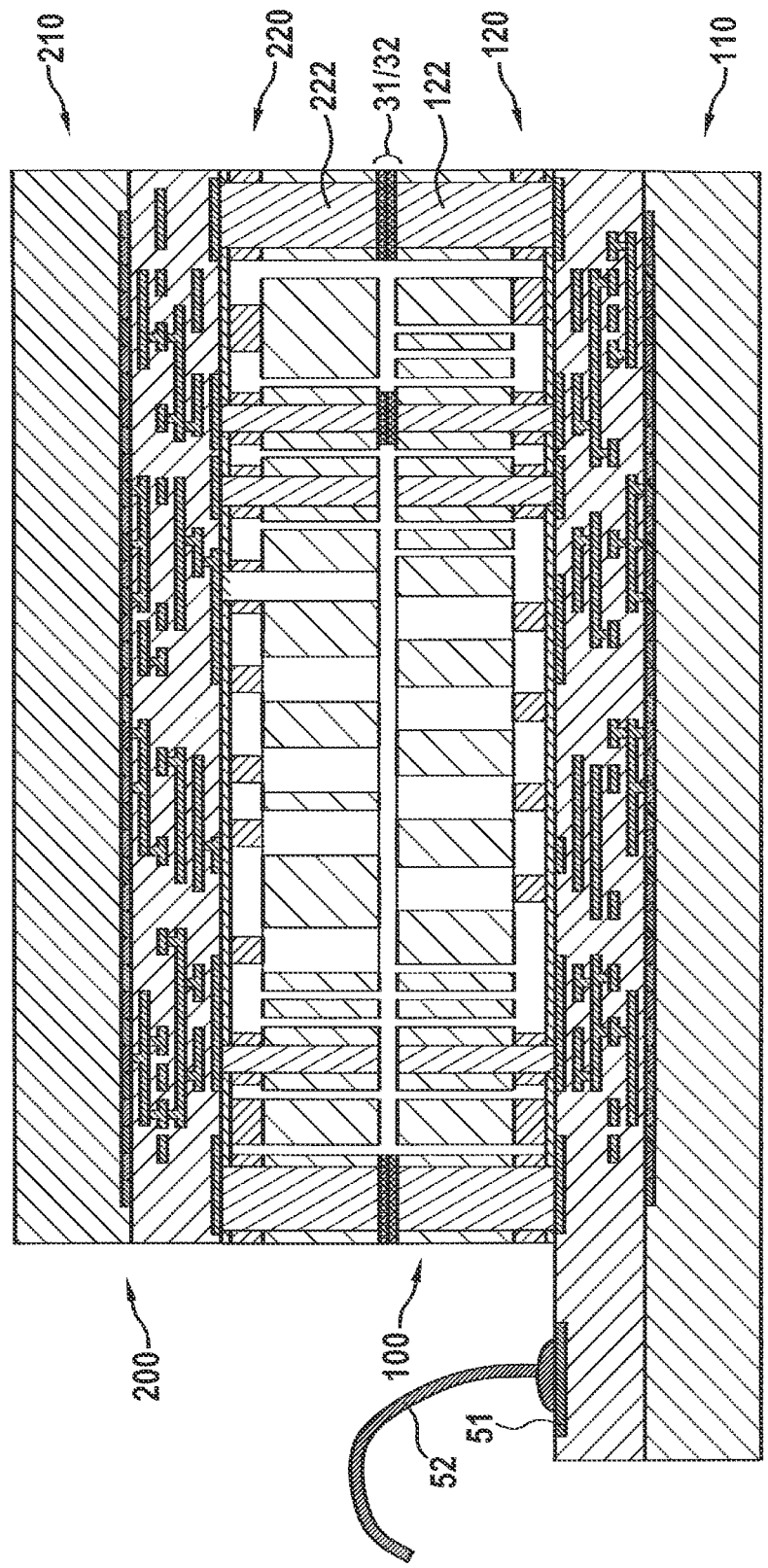

The components according to the present invention may also be contacted electrically within the scope of the second level assembly via wire bonds. For this purpose, electrical terminal pads 51 are formed on the top side of ASIC 110 in component 50 shown in FIG. 11. The material of the assigned MEMS element 120 over these terminal pads 51 was removed in a sawing or etching process exactly like the material of the second MEMS/ASIC wafer stack 200 to expose terminal pads 51 and thus permit an external contacting of component 50 via wire bonds 52.

What is claimed is:

1. A method for manufacturing hybrid integrated components each having at least two MEMS elements, at least one ASIC element being assigned to each MEMS element, the method comprising:
   initially creating two MEMS/ASIC wafer stacks independently of one another, by performing the following:
      processing two ASIC substrates independently of one another;
      mounting a semiconductor substrate on the processed surface of each of the two ASIC substrates; and
      subsequently creating a micromechanical structure in each of the two semiconductor substrates;
   mounting the two MEMS/ASIC wafer stacks on top of each other, MEMS on MEMS; and
   subsequently separating the components.

2. The method as recited in claim 1, wherein the processed surface of at least one of the two ASIC substrates is structured by at least one of (i) creating at least one recess in an area beneath the micromechanical structure of the MEMS element to be created, and (ii) creating a pedestal structure for mounting an assigned MEMS substrate.

3. The method as recited in claim 2, wherein at least one of the two MEMS substrates is bonded to the assigned ASIC substrate.

4. The method as recited in claim 2, wherein at least one of the two MEMS substrates is thinned down to a predefined structural height of the micromechanical structure to be created, so that subsequently a micromechanical structure extending over the entire thickness of the MEMS substrate is created.

5. The method as recited in claim 2, wherein the micromechanical structure is created in at least one of the two MEMS substrates in a trench process.

6. The method as recited in claim 2, wherein at least one through-contact which establishes an electrical connection between a selected ASIC substrate and a surface of an MEMS substrate facing away from the selected ASIC substrate is created in at least one of the two MEMS substrates.

7. The method as recited in claim 6, wherein mechanical and electrical connections between the two MEMS/ASIC wafer stacks are established in a bond process.

* * * * *